US012610456B2

(12) United States Patent
Chen et al.

(10) Patent No.: US 12,610,456 B2
(45) Date of Patent: Apr. 21, 2026

(54) FLEXIBLE CIRCUIT BOARD, DISPLAY PANEL AND METHOD FOR MANUFACTURING SAME, AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Yonglin Chen, Beijing (CN); Yunhan Xiao, Beijing (CN); Hongjin Hu, Beijing (CN); Jiaxiang Zhang, Beijing (CN); Kun Zuo, Beijing (CN); Mingqiang Wang, Beijing (CN); Jiuyuan Bai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 352 days.

(21) Appl. No.: 18/273,772

(22) PCT Filed: Oct. 22, 2021

(86) PCT No.: PCT/CN2021/125636
§ 371 (c)(1),
(2) Date: Jul. 23, 2023

(87) PCT Pub. No.: WO2022/188415
PCT Pub. Date: Sep. 15, 2022

(65) Prior Publication Data
US 2024/0090127 A1 Mar. 14, 2024

(30) Foreign Application Priority Data
Mar. 8, 2021 (CN) ......................... 202110252149.9

(51) Int. Cl.
H05K 1/18 (2006.01)
H05K 1/02 (2006.01)
(Continued)

(52) U.S. Cl.
CPC ......... H05K 1/0283 (2013.01); H05K 1/0298 (2013.01); H05K 1/118 (2013.01);
(Continued)

(58) Field of Classification Search
CPC .... H05K 1/0283; H05K 1/0298; H05K 1/118; H05K 1/147; H05K 1/189
(Continued)

(56) References Cited

U.S. PATENT DOCUMENTS 10,804,490 B2 * 10/2020 Namkung ............ H10K 59/873
2009/0117688 A1 5/2009 Karashima et al.
(Continued)

FOREIGN PATENT DOCUMENTS

CN 101142665 A 3/2008
CN 101226906 A 7/2008
(Continued)

OTHER PUBLICATIONS

PCT/CN2021/125636 international search report.
(Continued)

*Primary Examiner* — Binh B Tran
(74) *Attorney, Agent, or Firm* — IPro, PLLC

(57) ABSTRACT

Provided is a flexible circuit board. The flexible circuit board includes a circuit substrate; wherein the circuit substrate is a multilayer flexible circuit board, wherein at least two layers of the multilayer flexible circuit board include plated sublayers, and a plurality of grooves are disposed in a first surface of the multilayer flexible circuit board, a depth of the groove being not less than a depth of the plated sublayer (Continued)

120
130
120B
130B
}100 closest to the first surface in the multilayer flexible circuit board.

20 Claims, 5 Drawing Sheets

(51) Int. Cl.

| | |
|---|---|
| *H05K 1/11* | (2006.01) |
| *H05K 1/14* | (2006.01) |
| *H05K 1/189* | (2026.01) |
| *H05K 3/303* | (2026.01) |
| *H05K 3/34* | (2006.01) |

(52) U.S. Cl.
CPC ............. *H05K 1/147* (2013.01); *H05K 1/189* (2013.01); *H05K 3/305* (2013.01); *H05K 3/3463* (2013.01); *H05K 2201/10128* (2013.01)

(58) Field of Classification Search
USPC ........................................................ 361/749
See application file for complete search history.

(56) References Cited

U.S. PATENT DOCUMENTS

| | | | |
|---|---|---|---|
| 2010/0025847 A1 | 2/2010 | Tomura et al. | |
| 2012/0206916 A1 | 8/2012 | Ohta | |
| 2015/0096173 A1 | 4/2015 | Yu et al. | |
| 2016/0315282 A1 | 10/2016 | Qian | |
| 2016/0359146 A1* | 12/2016 | Wu | H10K 50/8426 |
| 2019/0250441 A1* | 8/2019 | Hiramoto | G02F 1/13452 |
| 2021/0217806 A1* | 7/2021 | Xi | H10H 20/857 |
| 2021/0257287 A1 | 8/2021 | Ma et al. | |

FOREIGN PATENT DOCUMENTS

| | | | |
|---|---|---|---|
| CN | 101578695 | A | 11/2009 |
| CN | 102265192 | A | 11/2011 |
| CN | 103491732 | A | 1/2014 |
| CN | 104103604 | A | 10/2014 |
| CN | 104332450 | A | 2/2015 |
| CN | 104659269 | A | 5/2015 |
| CN | 105491787 | A | 4/2016 |
| CN | 106255310 | A | 12/2016 |
| CN | 110320972 | A | 10/2019 |
| CN | 111370593 | A | 7/2020 |
| CN | 113038698 | A | 6/2021 |
| JP | H01226195 | A | 9/1989 |
| JP | 2009105303 | A | 5/2009 |
| JP | 3228842 | U | 11/2020 |
| TW | 200512910 | A | 4/2005 |
| TW | 201209971 | A | 3/2012 |
| WO | 2020233562 | A1 | 11/2020 |

OTHER PUBLICATIONS

CN202110252149.9 first office action.
CN202110252149.9 Notification to grant patent right for invention.

\* cited by examiner 120
130
120B
130B

100

100

600

700

500

800

A

300

A'

100
300

FLEXIBLE CIRCUIT BOARD, DISPLAY PANEL AND METHOD FOR MANUFACTURING SAME, AND DISPLAY DEVICE

CROSS-REFERENCE TO RELATED APPLICATION

This application is a U.S. national phase application based on PCT/CN2021/125636, filed on Oct. 22, 2021, which claims priority to Chinese Patent Application No. 202110252149.9, filed on Mar. 8, 2021, the disclosures of which are incorporated herein by reference in their entireties.

TECHNICAL FIELD

The present disclosure related the field of display, and in particular to a flexible circuit board, a display panel and a method for manufacturing the same, and a display device.

BACKGROUND

With the continuous development of display panels, the flexible multilayer on cell (FMLOC) technology, as an emerging technology of flexible organic light-emitting diode (OLED) has large application prospects.

SUMMARY

According to some embodiments of the present disclosure, a flexible circuit board is provided. The flexible circuit board includes a circuit substrate, wherein the circuit substrate is a multilayer flexible circuit board, wherein at least two layers of the multilayer flexible circuit board include plated sublayers, and a plurality of grooves are disposed in a first surface of the multilayer flexible circuit board, a depth of the groove being not less than a depth of the plated sublayer closest to the first surface in the multilayer flexible circuit board. In this way, the grooves are formed on the surface of the flexible circuit board in a relatively simple method. The grooves on the flexible circuit board improve the uniformity of the bottom filling adhesive and thus effectively reduce air bubbles during the bottom filling process.

According to some embodiments of the present disclosure, the depth of the groove is equal to a depth of the plated sublayer of the multilayer flexible circuit board. In this way, the plurality of grooves with improved uniformity of the bottom filling adhesive are acquired in a relatively simple method.

According to some embodiments of the present disclosure, the groove includes a bottom surface and an opening, an orthographic projection of the bottom surface of the groove on the circuit substrate being within an orthographic projection of the opening of the groove on the circuit substrate. In this way, the grooves on the flexible circuit board improve the uniformity of the flow of the bottom filling adhesive.

According to some embodiments of the present disclosure, a shape of a cross section of the groove in a direction perpendicular to a plane of the circuit substrate is a trapezoid, at least one of four base angles of the trapezoid having an angle of 120° to 150°. In this way, the grooves on the flexible circuit board further improve the uniformity of the flow of the bottom filling adhesive.

According to some embodiments of the present disclosure, a shape of a cross section of the groove in a direction perpendicular to a plane of the circuit substrate is a triangle. In this way, the grooves on the flexible circuit board further improve the uniformity of the flow of the bottom filling adhesive.

According to some embodiments of the present disclosure, a shape of a cross section of the groove in a direction perpendicular to a plane of the circuit substrate is a circle. In this way, the grooves on the flexible circuit board further improve the uniformity of the flow of the bottom filling adhesive.

According to some embodiments of the present disclosure, a display panel is provided. The display panel includes the flexible circuit board as previously described, and a chip circuit board, electrically connected to the flexible circuit board by a plurality of solder joints, wherein a securing adhesive is applied between the flexible circuit board and the chip circuit board, the securing adhesive is at least distributed in gaps between the plurality of solder joints, wherein a plurality of grooves are disposed in at least one of a surface, close to the chip circuit board, of the flexible circuit board and a surface, close to the flexible circuit board, of the chip circuit board, and the solder joints are disposed between the plurality of grooves. By soldering the chip circuit board to the flexible circuit board with grooves and filling the bottom between the chip circuit board and the flexible circuit board, highly reliable solder joints are achieved, and throughout air bubbles are not present between adjacent solder joints, thus increasing the using stability of the display panel.

According to some embodiments of the present disclosure, the display panel further includes a touch metal layer and a touch wire layer, wherein the touch wire layer is configured to drive the touch metal layer, the touch wire layer is disposed at least partially on layers of the flexible circuit board other than the plated sublayer closest to the first surface, and the touch wire layer is electrically connected to the solder joints. In this way, the performance of the display panel is improved.

According to some embodiments of the present disclosure, an orthographic projection of the solder joints on the flexible circuit board is not overlapped with any of the plurality of grooves on the flexible circuit board. In this way, the reliability of the solder joints is improved.

According to some embodiments of the present disclosure, the display panel includes a plurality of the solder joints, wherein the plurality of joints are arranged in arrays. In this way, the quantity of solder joints per unit area is further increased and the reliability of the solder joints is further improved.

According to some embodiments of the present disclosure, one portion of the plurality of grooves extends in a first direction and the other portion of the plurality of grooves extends in a second direction, and the first direction is perpendicular to the second direction. In this way, the flexible circuit board is utilized to the maximum and the grooves with a better uniformity of the bottom filling adhesive are acquired According to some embodiments of the present disclosure, the grooves and the solder joints are disposed alternately. In this way, the space utilization of flexible circuit board and chip board is effectively increased and the solder joints with good fixing effects are acquired.

According to some embodiments of the present disclosure, the securing adhesive is a bottom filling adhesive. In this way, the solder joints are further fixed.

According to some embodiments of the present disclosure, alignment marks are disposed on the surface, close to the chip circuit board, of the flexible circuit board and the surface, close to the flexible circuit board, of the chip circuit board, and the alignment marks includes preset spacers. In this way, the accuracy of positioning the chip board onto the flexible circuit board is further improved.

According to some embodiments of the present disclosure, a method for manufacturing the display panel as previously described is provided. The method includes: providing a flexible circuit board, providing a chip circuit board, wherein a side of the flexible circuit board having the plurality of grooves is close to the chip circuit board, and a plurality of solder joints are formed between the flexible circuit board and the chip circuit board, and injecting a securing adhesive between the flexible circuit board and the chip circuit board, such that the securing adhesive is at least distributed in gaps between the plurality of solder joints. The display panel manufactured by the method is the display panel described previously, and the method has all the features and advantages of the display panels described previously, which are repeated herein. In conclusion, the display panel manufactured by the method has a high yield and good using stability.

According to some embodiments of the present disclosure, the solder joints are formed by at least one of flow soldering or dip soldering. In this way, the solder joints with a stable structure are acquired in a relatively simple method.

According to some embodiments of the present disclosure, a display device is provided. The display device includes the display panel as previously described. In this way, the display panel has all the features and advantages of the display panels described previously, which are repeated herein.

BRIEF DESCRIPTION OF DRAWINGS

The foregoing and/or additional aspects and advantages of the present disclosure will become apparent and readily understood from the description of the embodiments in conjunction with the accompanying drawings below, wherein.

DETAILED DESCRIPTION

The embodiments of the present disclosure will be explained in detail below. Examples of the embodiments are shown in the accompanying drawings, wherein the same or similar designations from beginning to end indicate the same or similar components or components having the same or similar functions. The embodiments described below by reference to the accompanying drawings are exemplary and are intended only to explain the present disclosure, and are not to be construed as limiting the present disclosure.

In the current FMLOC scheme, generally a chip circuit board is secured to a flexible circuit board by the surface mount technology (SMT). However, the chip circuit board and the flexible circuit board secured by the SMT is prone to a short circuit between the solder joints and other problems, leading to a failure of the panel test, and the panel fails to operate normally. As a consequence, a great waste of consumables and energy is caused. Therefore, the conventional flexible circuit board, display panel and method for manufacturing the display panel, and display device still need to be improved.

The present disclosure is intended to solve, to some extent, one of the technical problems in the related art.

Figure 1:
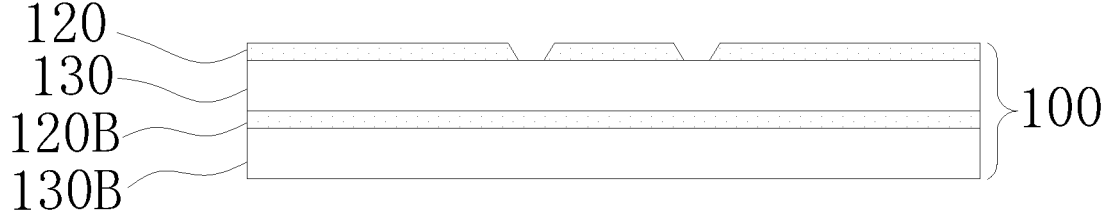
FIG. 1 is a schematic diagram of a front view structure of a flexible circuit board according to some embodiments of the present disclosure.
Figure 2:
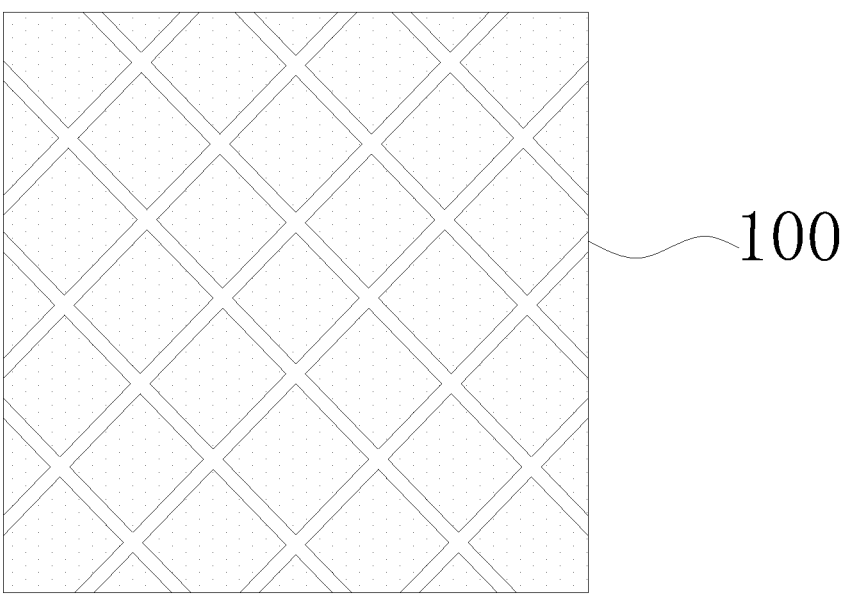
FIG. 2 is a schematic diagram of a top view structure of a flexible circuit board according to some embodiments of the present disclosure.

In one aspect of the present disclosure, with reference to FIGS. 1 and 2, the present disclosure provides a flexible circuit board 100. The flexible circuit board 100 includes a circuit substrate, being a multilayer flexible circuit board, wherein at least two layers of the multilayer flexible circuit board have plated sublayers, a first surface of the multilayer flexible circuit board has a plurality of grooves, a depth of the groove is not less than a depth of the plated sublayer 120 closest to the first surface in the multilayer flexible circuit board, and insulating sublayers 130 are disposed between adjacent plated sublayers 120. The grooves on the flexible circuit board improve the uniformity of the bottom filling adhesive and thus effectively reduce air bubbles during the bottom filling process.

It should be noted in particular that the first surface of the flexible circuit board with a quantity of grooves improves the uniformity of the bottom filling adhesive. In addition, the solder joints need to be formed between the first surface of the flexible circuit board and the chip circuit board to electrically connect the flexible circuit board to the chip circuit board, such that the normal operation of the chip circuit board is ensured. Therefore, those in the art can understand that the first surface of the flexible circuit board needs to have the plated sublayers to achieve the above effects simultaneously.

For ease of understanding, the principles by which the display panel can achieve the beneficial effects described above are first briefly described below.

Figure 6:
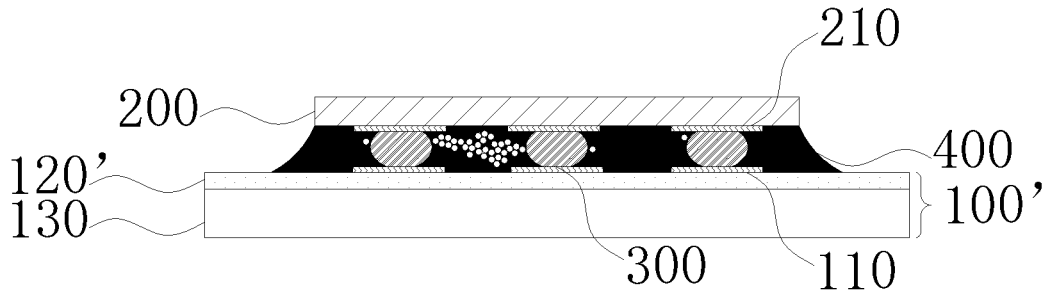
FIG. 6 is a schematic diagram of a partial structure of a display panel in related art.

In the related art, with reference to FIG. 6, in the case that the chip circuit board 200 is fixed to the flexible circuit board 100', i.e. after forming the solder joints 300 between the flexible circuit board 100' and the chip circuit board 200, the bottom filling adhesive 400 is used to fill the bottom between the chip circuit board 200 and the flexible circuit board 100'. Because the bottom filling adhesive 400 flows between the chip circuit board 200 and the flexible circuit board 100', due to the different roughness of the surface of the solder joints 300 and the randomness of the flow, the bottom filling adhesive 400 is easy to flow non-uniform between the chip circuit board 200 and the flexible circuit board 100', which leads to non-uniform distribution of the bottom filling adhesive 400 around the solder joints 300, and the air bubbles are formed around the solder joints 300. In the case that the air bubbles around the solder joints 300 are too many, that is, the formation of through air bubbles, the solder joints 300 are not completely surrounded by the bottom filling adhesive 400, that is, the solder joints 300 are not fixed in place by the bottom filling adhesive 400, which will lead to deformation of the solder joints 300 due to external forces during assembly and utilization, and short-circuiting occurs between adjacent solder joints 300 through the penetration air bubbles, which eventually cause the display panel to fail the test.

Figure 5:
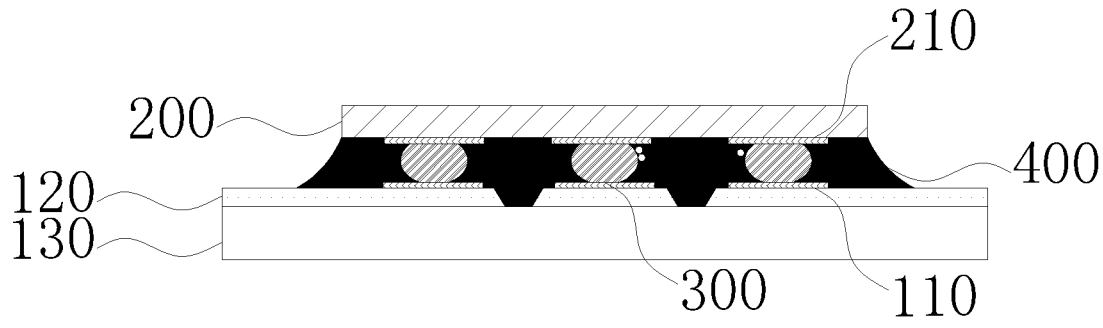
FIG. 5 is a schematic diagram of a partial cross-section structure of a display panel along the AA' direction shown in FIG. 3 according to some embodiments of the present disclosure.

In this application, with reference to FIG. 5, the inventors have found that by structuring the flexible circuit board 100 in the corresponding region of the chip circuit board 200, i.e. by etching the surface layer of the flexible circuit board 100, grooves are formed on the surface layer of the flexible circuit board 100. Taking the trapezoidal grooves as an example, the chip circuit board 200 is then fixed to the flexible circuit board 100, and the bottom filling adhesive 400 is used to fill the bottom between the chip circuit board 200 and the flexible circuit board 100. In the case that the grooves described above are disposed on the flexible circuit board 100, the adhesive preferentially flow smoothly along the trapezoidal grooves when the bottom filling adhesive 400 is filled. The surface tension of the adhesive in the grooves is maximized when all grooves are filled. The subsequent the bottom filling adhesive 400 flowing through the grooves exceeds the maximum tension on the surface of the adhesive in the grooves and starts to overflow to the sides under the influence of gravity. Because gravity does not bring additional directionality in a plane perpendicular to gravity, the overflow from the grooves to the sides of the grooves is more uniform. And because the grooves are around each of the solder joints 300, each of the solder joints 300 is covered by the bottom filling adhesive 400 in front, back, left, and right directions, greatly reducing the randomness of the adhesive filling process in the prior designs. By avoiding or minimizing the air bubbles generated during the filling process due to randomness of not flowing through or not flowing around the solder joints, the present disclosure greatly reduces the possibility of penetration air bubbles due to multiple bubble connections, further enhancing the reliability of the solder joints and avoiding the risk of short-circuiting between the solder joints due to penetration air bubbles.

According to some embodiments of the present disclosure, the type of circuit substrate is not particularly limited. For example, the circuit substrate is a multilayer flexible circuit board, because each layer of the multilayer flexible circuit board has a plated sublayer, and the material for forming the plated sublayer is generally copper. In this way, the grooves with a specific structure can be formed on the surface of the circuit substrate by a relatively simple method, such as etching.

According to some embodiments of the present disclosure, the depth of the grooves is not particularly limited. For example, the depth of the grooves is the same as the depth of the plated sublayer of the multilayer flexible circuit board. In the case that the depth of grooves is the same as the depth of the plated sublayer of the multilayer flexible circuit board, the grooves improve the uniformity of the flow of the bottom filling adhesive for filling the bottom without causing excessive waste to the multilayer flexible circuit board due to the depth of the grooves.

According to some embodiments of the present disclosure, the structure of the grooves is not particularly limited. For example, the grooves have an opening and a bottom surface, and the orthographic projection the bottom surface of the groove on the circuit substrate is within the orthographic projection of the opening of the groove on the circuit substrate. In the case that the structure of the groove is the above shape, when the bottom filling adhesive is filled, after the adhesive is uniformly filled with all the grooves, the adhesive continues to be injected, and the adhesive begins to overflow uniformly to both sides under the action of gravity, thereby improving the uniformity of flow of the bottom filling adhesive.

According to some embodiments of the present disclosure, the shape of the grooves is not particularly limited. For example, the shape of the cross section of the grooves in a direction perpendicular to the plane of the circuit substrate is a trapezoid, at least one of the four base angles of the trapezoid having an angle of 120° to 150°. According to an embodiment of the present disclosure, the shape of the cross section of the recess in a direction perpendicular to the plane in which the circuit substrate is located may be triangular. According to some embodiments of the present disclosure, the shape of the cross section of the groove in the direction perpendicular to the plane of the circuit substrate a circle.

In another aspect of the present disclosure, a display panel is provided. Referring to FIG. 5, for ease of understanding, only a plated sublayer 120 and an insulated sublayer 130 are shown. The display panel includes a flexible circuit board 100 as described above, a chip circuit board 200, the chip circuit board 100 being electrically connected to the flexible circuit board 200 by a plurality of solder joints 300. A securing adhesive 400 is disposed between the flexible circuit board 100 and the chip circuit board 200, and the securing adhesive 400 is at least distributed in gaps between the plurality of solder joints 300. One of a surface, close to the chip circuit board 100, of the flexible circuit board 200 and a surface, close to the flexible circuit board 200, of the chip circuit board 100 has a plurality of grooves, the solder joints 300 are disposed between the plurality of grooves. By soldering the chip circuit board to the flexible circuit board with grooves and filling the bottom between the chip circuit board and the flexible circuit board, highly reliable solder joints are achieved, and throughout air bubbles are not present between adjacent solder joints, thus increasing the using stability of the display panel.

According to some embodiments of the present disclosure, the type of chip circuit board is not particularly limited. For example, the chip circuit board is a touch chip circuit board.

Figure 3:
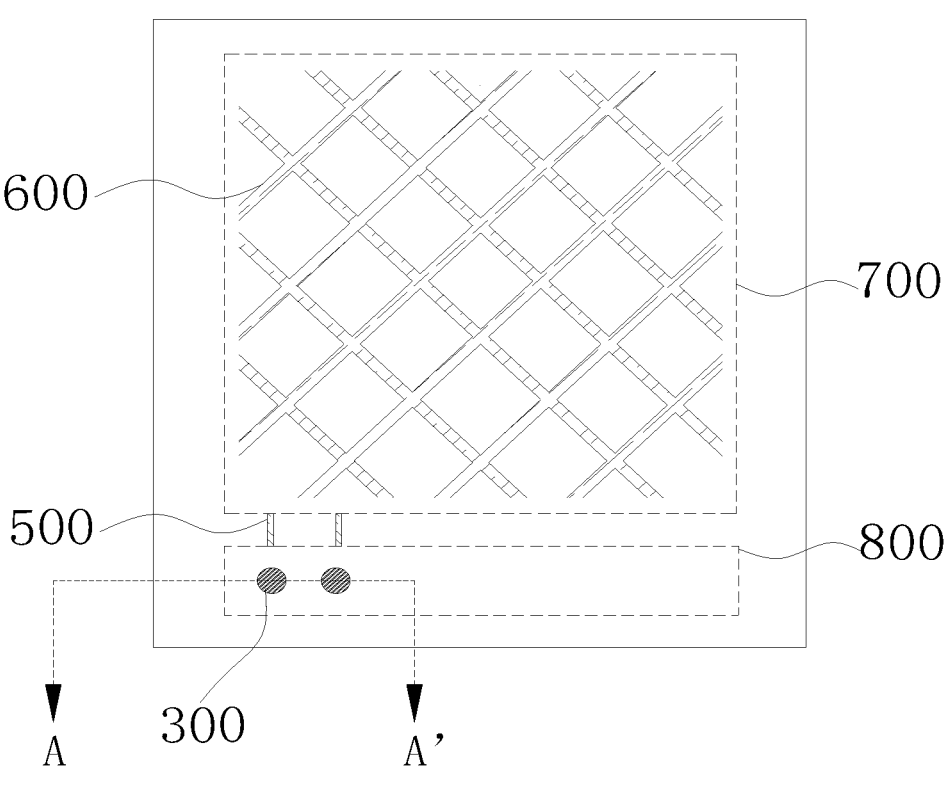
FIG. 3 is a schematic diagram of a top view structure of a display panel according to some embodiments of the present disclosure.

According to some embodiments of the present disclosure, with reference to FIG. 3, the structure of the display panel is not particularly limited. For example, in the case that the chip circuit board is a touch chip circuit board, the display panel further includes a touch metal layer 600 and a touch wire layer 500. The touch wire layer 600 is configured to drive the touch metal layer 500, and the touch metal layer transmits the received touch singles via the touch wire layer to the touch chip circuit board for subsequent data processing. The touch metal layer 600 is within the pixel region 700, and the touch wire layer 500 is primarily within the peripheral region, i.e., the region of the display panel other than the pixel region 700, and the touch wire layer 500 extends to the binding region 800 and is electrically connected to the solder joints 300 within the binding region 800. A portion of the touch wire layer 500 within the binding region 800 is at least partially on a layer of the flexible circuit board other than the plated sublayer 120. Therefore, the performance of the display panel is further improved by the provision of a touch wire layer and a touch metal layer.

Figure 4:
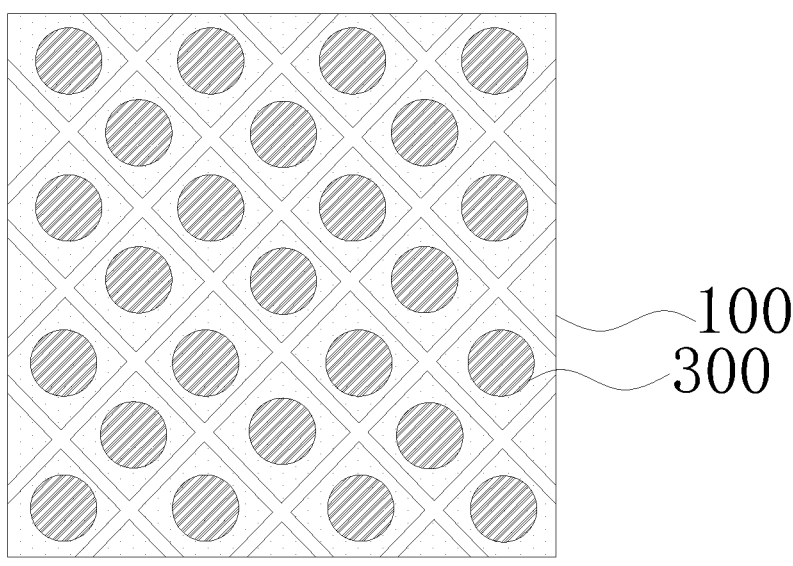
FIG. 4 is a schematic diagram of a partial top view structure of a display panel according to some embodiments of the present disclosure.

According to some embodiments of the present disclosure, with reference to FIG. 4, the position of the solder joints 300 on the flexible circuit board 100 is not particularly limited. For example, the orthographic projection of the solder joints on the flexible circuit board is not overlapped with any of the plurality of grooves on the flexible circuit board. In the case that the solder joints have similar size, the contact region between the solder joints and the flexible circuit board and the contact region between the solder joints and the chip circuit board is maximized, when the orthographic projection of the solder joints on the flexible circuit board is not overlapped with the plurality of grooves on the flexible circuit board, and the soldering effect is enhanced.

According to some embodiments of the present disclosure, with reference to FIG. 4, the arranging manner of the plurality of solder joints on the flexible circuit board 100 is not particularly limited. For example, the plurality of solder joints are arranged in an array. In the case that the solder joints are arranged in an array, the solder joints are more uniformly distributed between the flexible circuit board and the chip circuit board, and the connection between the chip circuit board and the flexible circuit board is stronger.

According to some embodiments of the present disclosure, with reference to FIG. 4, the orientation of the plurality of grooves on the flexible circuit board 100 is not particularly limited. For example, one portion of the plurality of grooves extend in a first direction and the other portion of the plurality of grooves extend in a second direction, and the first direction is perpendicular to the second direction. In this way, it is easy to manufacture solder joints with an array structure and a more uniform flow of the bottom filling adhesive between the flexible circuit board and the chip circuit board. According to some embodiments of the present disclosure, the grooves and the solder joints are disposed alternately, thus effectively improving the uniformity of the flow when filling the bottom filling adhesive and increasing the space utilization.

According to some embodiments of the present disclosure, the type of securing adhesive is not particularly limited. For example, the securing adhesive is a bottom filling adhesive. Specifically, the securing adhesive is an epoxy resin.

According to some embodiments of the present disclosure, the structure of the flexible circuit board and the chip circuit board is not particularly limited. For example, alignment marks are disposed on the surface, close to the chip circuit board, of the flexible circuit board, and the surface, close to the flexible circuit board, of the chip circuit board. Specifically, the alignment marks are preset spacers. In this way, preset spacers of the flexible circuit board and the chip circuit board is used for positioning, and a quantity of solder joints are formed subsequently between the flexible circuit board and the chip circuit board. Referring to FIG. 5, after placing the side of the flexible circuit board having a plurality of grooves close to the chip board, the alignment accuracy is improved by aligning the flexible circuit board preset spacers 110 with the chip circuit board preset spacers 210, improving the accuracy of the chip board position and increasing the utilization of the flexible circuit board.

According to some embodiments of the present disclosure, the method for forming the plurality of grooves on the surface of one side of the circuit substrate without wire is not particularly limited. For example, the plurality of grooves are formed on the surface of one side of the circuit substrate without wire by etching.

Figure 10:
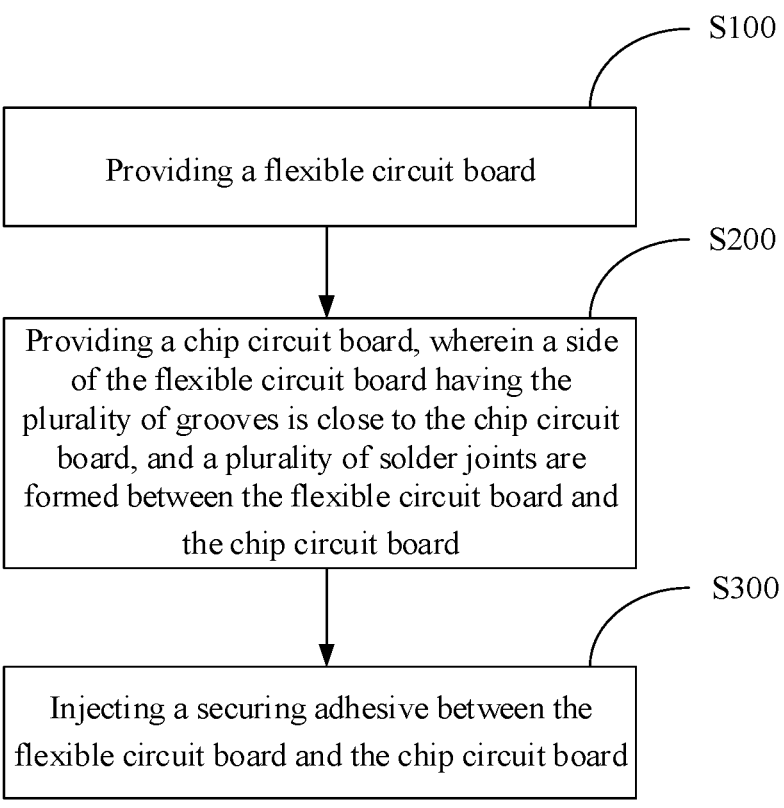
FIG. 10 is a schematic diagram of a flow of a method for manufacturing a display panel according to some embodiments of the present disclosure.

In still another aspect of the present disclosure, a method for manufacturing the display panel as described above is provided, by which the display panel is manufactured with a high yield and has a good using stability. Specifically, with reference to FIG. 10, the method specifically includes the following steps.

In S100, a flexible circuit board is provided.

According to some embodiments of the present disclosure, this step provides the flexible circuit board as previously described, i.e. the flexible circuit board has a plurality of grooves on one side of the flexible circuit board.

According to some embodiments of the present disclosure, the grooves are formed on the side, without a metal wire, of the flexible circuit board t, and the grooves are formed by etching. The shape of the cross-section, the extending direction and arrangement of the grooves in a direction perpendicular to the plane of the circuit substrate have been described in detail above, which are repeated herein.

In S200, a chip circuit board is provided, wherein a side of the flexible circuit board having the plurality of grooves is close to the chip circuit board, and a plurality of solder joints are formed between the flexible circuit board and the chip circuit board.

According to some embodiments of the present disclosure, the chip circuit board and the flexible circuit board are connected by soldering at this step, and the manner of forming the solder joints is not particularly limited. For example, the solder joints are formed by at least one of flow soldering or dip soldering.

In S300, a securing adhesive is injected between the flexible circuit board and the chip circuit board.

According to some embodiments of the present disclosure, the securing adhesive is injected at this step, such that the securing adhesive is at least distributed in the gaps between the plurality of solder joints, thereby reinforcing the solder joints and improving the reliability of the solder joints. The type of securing adhesive is not particularly limited. For example, the securing adhesive is a bottom filling adhesive. Specifically, the securing adhesive is an epoxy resin.

Figure 7:
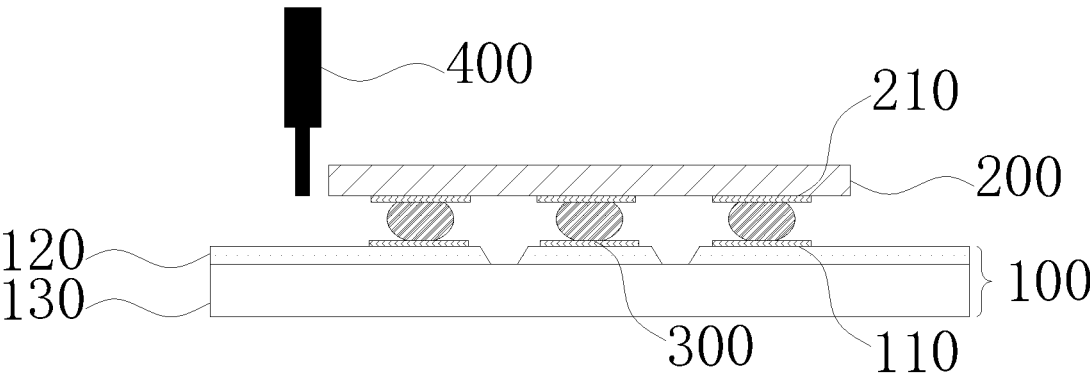
FIG. 7 is a schematic diagram of a partial top view structure of a display panel according to some embodiments of the present disclosure.
Figure 8:
FIG. 8 is a schematic diagram of a single-side sizing process according to some embodiments of the present disclosure.
Figure 8:
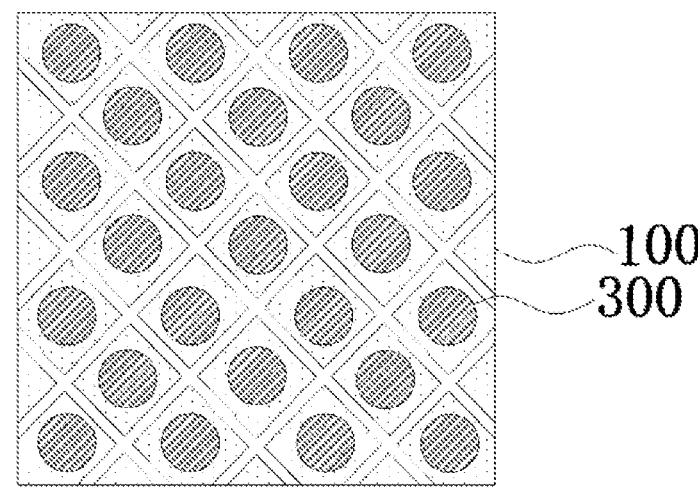
Figure 9:
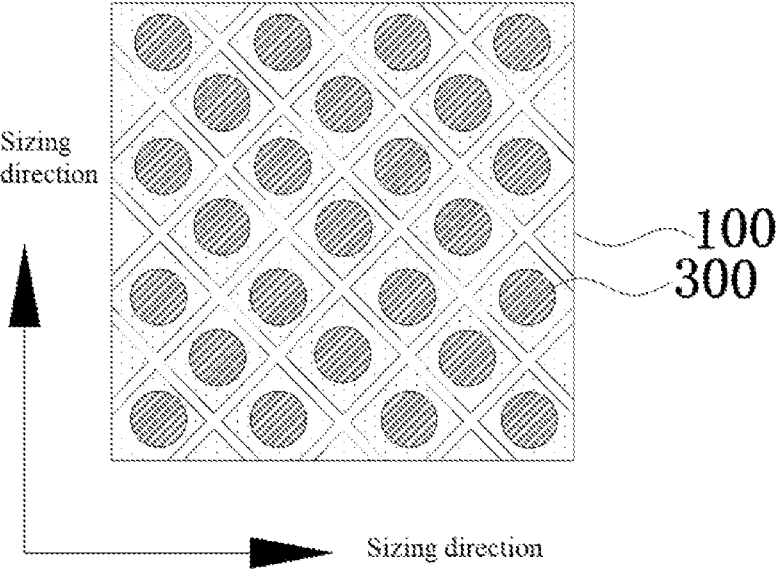
FIG. 9 is a schematic diagram of a L-shaped sizing process according to some embodiments of the present disclosure.

According to some embodiments of the present disclosure, with reference to FIGS. 7, 8 and 9, the manner of injecting the securing adhesive between the flexible circuit board and the chip circuit board is not particularly limited. For example, the manner of injecting the securing adhesive between the flexible circuit board and the chip circuit board is a single-side sizing or an L-shaped sizing.

In still another aspect of the present disclosure, a display device is provided, including the display panel as described above. The display device has all the features and advantages of the display panel as described above, which are be repeated herein.

The embodiments of the present disclosure are described below by specific embodiments. It should be noted that the following embodiments are intended to illustrate the present disclosure only and should not be considered as limiting the scope of the present disclosure. The specific techniques or conditions not indicated in the embodiments are the techniques or conditions described in the literature in the field or the product specification. The reagents or instruments not specified as manufacturers are commercially available conventional products.

Embodiment 1

1. A circuit substrate is provided. The circuit substrate is a multilayer flexible circuit board, a plurality of grooves are formed on the surface, without wire, of the multilayer flexible circuit board by etching, the plurality of grooves are intersected with each other perpendicularly, the depth of the grooves is the same as the thickness of the plated sublayer of the multilayer flexible circuit board.
2. A touch chip circuit board is provided. The side, with the plurality of grooves, of the flexible circuit board is placed close to the chip circuit board, and an array of solder joints is formed between the flexible circuit board and the touch chip circuit board by dip soldering.
3. The bottom filling adhesive is injected between the flexible circuit board and the touch chip circuit board by single-side sizing.

The results show that, as shown in FIG. 5, the bottom filling adhesive is uniformly distributed between the flexible circuit board and the touch chip circuit board, the solder joints are fixed in place, and it can be seen by mirror inspection that there are no penetration air bubbles between adjacent solder joints, and the display panel passes the touch panel test.

Comparison Embodiment 1

1. A circuit substrate is provided. The circuit substrate is a multilayer flexible circuit board.
2. A touch chip circuit board is provided. A side of the flexible circuit board is placed close to the chip circuit board, and an array of solder joints is formed between the flexible circuit board and the touch chip circuit board by dip soldering.
3. The bottom filling adhesive is injected between the flexible circuit board and the touch chip circuit board by single-side sizing.

The results show that, as shown in FIG. 6, the distribution of the bottom filling adhesive between the flexible circuit board and the touch chip circuit board is extremely uneven. As can be seen through the microscopic observation, there are a large quantity of air bubbles between adjacent solder joints, and forming penetration air bubbles. The solder joints are deformed in the touch panel test, short circuit occurs through the penetration air bubbles between adjacent solder joints, and the display panel does not pass the touch panel test.

In the description of this application, the terms "up," "down," and the like indicate an orientation or positional relationship that is based on the orientation or positional relationship shown in the accompanying drawings, and are intended only to facilitate the description of the application, but do not require that the application should be constructed and operated in a particular orientation, and are therefore not to be construed as limiting the application.

In the description, reference to the terms "an embodiment," "some embodiments," "examples," "specific examples," or "some examples" indicates that specific features, structures, materials, or characteristics described in conjunction with the embodiment or example are included in at least one embodiment or example of the present disclosure. In this description, the schematic expressions of the above terms need not refer to the same embodiment or example. Furthermore, the specific features, structures, materials or characteristics described may be combined in a suitable manner in any one or more of the embodiments or examples. Furthermore, without contradicting each other, a person skilled in the art may combine and combine the different embodiments or examples described in this description and the features of the different embodiments or examples.

Although embodiments of the present disclosure have been shown and described above, it is understood that the above embodiments are exemplary and are not to be construed as limiting the present disclosure. Variations, modifications, replacements and variants of the above embodiments can be made by those of ordinary skill in the art within the scope of the present disclosure.

What is claimed is:
1. A display panel, comprising:
a flexible circuit board, wherein the flexible circuit board comprises a circuit substrate, and the circuit substrate is a multilayer flexible circuit board, wherein at least two layers of the multilayer flexible circuit board comprise plated sublayers, and a plurality of grooves are disposed in a first surface of the multilayer flexible circuit board, a depth of the groove being not less than a depth of the plated sublayer closest to the first surface in the multilayer flexible circuit board; and
a chip circuit board, electrically connected to the flexible circuit board by a plurality of solder joints, wherein a securing adhesive is applied between the flexible circuit board and the chip circuit board, and the securing adhesive is at least distributed in gaps between the plurality of solder joints;
wherein a plurality of grooves are disposed in at least one of a surface, close to the chip circuit board, of the flexible circuit board and a surface, close to the flexible circuit board, of the chip circuit board; and
the solder joints are disposed between the plurality of grooves.
2. The display panel according to claim 1, further comprising: a touch metal layer and a touch wire layer, wherein the touch wire layer is configured to drive the touch metal layer, the touch wire layer is disposed at least partially on layers of the flexible circuit board other than the plated sublayer closest to the first surface, and the touch wire layer is electrically connected to the solder joints.
3. The display panel according to claim 2, wherein an orthographic projection of the solder joints on the flexible circuit board is not overlapped with any of the plurality of grooves on the flexible circuit board.
4. The display panel according to claim 3, comprising: a plurality of the solder joints, wherein the plurality of joints are arranged in arrays.
5. The display panel according to claim 3, wherein one portion of the plurality of grooves extend in a first direction and the other portion of the plurality of grooves extend in a second direction, and the first direction is intersected with the second direction.
6. The display panel according to claim 5, wherein the grooves and the solder joints are disposed alternately.
7. The display panel according to claim 1, wherein the securing adhesive is a bottom filling adhesive.
8. The display panel according to claim 1, wherein alignment marks are disposed on the surface, close to the chip circuit board, of the flexible circuit board and the surface, close to the flexible circuit board, of the chip circuit board, and the alignment marks comprises preset spacers.
9. A method for manufacturing the display panel as defined in claim 1, comprising:
providing a flexible circuit board, providing a chip circuit board, wherein a side of the flexible circuit board having the plurality of grooves is close to the chip circuit board, and forming a plurality of solder joints between the flexible circuit board and the chip circuit board, and injecting a securing adhesive between the flexible circuit board and the chip circuit board, such that the securing adhesive is at least distributed in gaps between the plurality of solder joints.

10. The method according to claim 9, wherein the solder joints are formed by at least one of flow soldering or dip soldering.

11. The display panel according to claim 1, wherein the depth of the groove is equal to a depth of the plated sublayer of the multilayer flexible circuit board.

12. The display panel according to claim 11, wherein the groove comprises a bottom surface and an opening, an orthographic projection of the bottom surface of the groove on the circuit substrate being within an orthographic projection of the opening of the groove on the circuit substrate.

13. The display panel according to claim 12, wherein a shape of a cross section of the groove in a direction perpendicular to a plane of the circuit substrate is a trapezoid, and at least one of four base angles of the trapezoid has an angle of 120° to 150°.

14. The display panel according to claim 12, wherein a shape of a cross section of the groove in a direction perpendicular to a plane of the circuit substrate is a triangle.

15. The display panel according to claim 12, wherein a shape of a cross section of the groove in a direction perpendicular to a plane of the circuit substrate is a circle.

16. A display device, comprising a display panel, wherein the display panel comprises:

a flexible circuit board, wherein the flexible circuit board comprises a circuit substrate, and the circuit substrate is a multilayer flexible circuit board, wherein at least two layers of the multilayer flexible circuit board comprise plated sublayers, and a plurality of grooves are disposed in a first surface of the multilayer flexible circuit board, a depth of the groove being not less than a depth of the plated sublayer closest to the first surface in the multilayer flexible circuit board; and a chip circuit board, electrically connected to the flexible circuit board by a plurality of solder joints, wherein a securing adhesive is applied between the flexible circuit board and the chip circuit board, and the securing adhesive is at least distributed in gaps between the plurality of solder joints;

wherein a plurality of grooves are disposed in at least one of a surface, close to the chip circuit board, of the flexible circuit board and a surface, close to the flexible circuit board, of the chip circuit board; and the solder joints are disposed between the plurality of grooves.

17. The display device according to claim 16, wherein the depth of the groove is equal to a depth of the plated sublayer of the multilayer flexible circuit board.

18. The display device according to claim 17, wherein the groove comprises a bottom surface and an opening, an orthographic projection of the bottom surface of the groove on the circuit substrate being within an orthographic projection of the opening of the groove on the circuit substrate.

19. The display device according to claim 18, wherein a shape of a cross section of the groove in a direction perpendicular to a plane of the circuit substrate is a trapezoid, and at least one of four base angles of the trapezoid has an angle of 120° to 150°.

20. The display device according to claim 18, wherein a shape of a cross section of the groove in a direction perpendicular to a plane of the circuit substrate is a triangle.

* * * * *